United States Patent [19]
Bone et al.

[11] Patent Number: 5,600,541
[45] Date of Patent: Feb. 4, 1997

[54] VERTICAL IC CHIP STACK WITH DISCRETE CHIP CARRIERS FORMED FROM DIELECTRIC TAPE

[75] Inventors: Robert Bone, Laguna Niguel; Kirti Vora, Irvine, both of Calif.

[73] Assignee: Hughes Aircraft Company, Los Angeles, Calif.

[21] Appl. No.: 510,735

[22] Filed: Aug. 3, 1995

Related U.S. Application Data

[63] Continuation of Ser. No. 163,463, Dec. 8, 1993, abandoned.

[51] Int. Cl.⁶ ............................................. H05K 7/20
[52] U.S. Cl. .................... 361/707; 257/686; 257/707; 361/761; 361/790; 439/67
[58] Field of Search ................ 174/52.1, 52.4, 174/252, 254, 260, 266; 439/65, 67, 68, 77; 257/685, 686, 706, 707, 713, 724; 200/307; 361/704, 707, 709–712, 716–719, 729, 730, 733, 735, 738, 749, 760, 761, 764, 767, 776, 778, 784, 790, 792

[56] References Cited

U.S. PATENT DOCUMENTS

| | | | |
|---|---|---|---|
| 4,630,172 | 12/1986 | Stenerson | 361/386 |
| 4,705,917 | 11/1987 | Gates, Jr. | 174/52 FP |
| 4,899,118 | 2/1990 | Polinski, Sr. | |
| 5,012,386 | 4/1991 | McShane | 361/386 |
| 5,043,794 | 8/1991 | Tai et al. | |
| 5,121,293 | 6/1992 | Conte | 361/749 |
| 5,128,831 | 7/1992 | Fox et al. | |
| 5,164,699 | 11/1992 | Smith | 338/310 |
| 5,239,448 | 8/1993 | Perkins | 361/764 |
| 5,247,423 | 9/1993 | Lin | 361/719 |
| 5,319,521 | 6/1994 | Adkins | 361/707 |
| 5,412,538 | 5/1995 | Kikinis | 361/792 |

FOREIGN PATENT DOCUMENTS

| | | |
|---|---|---|
| 0488641 | 6/1992 | European Pat. Off. |
| 2077036 | 12/1981 | United Kingdom |
| WO95/00972 | 1/1995 | WIPO |

OTHER PUBLICATIONS

Vitriol et al., "Development of a Low Temperature Cofired Multi–Layer Ceramic Technology", ISHM Proceedings, 1983, pp. 593–598.

IBM Technical Disclosure Bulletin, vol. 31, No. 4, Sep. 1988, New York, pp. 372–373.

Research Disclosure, No. 337, May 1992, Havant GB, p. 362.

*Primary Examiner*—Gerald P. Tolin
*Attorney, Agent, or Firm*—M. E. Lachman; M. W. Sales; W. K. Denson-Low

[57] ABSTRACT

A 3-D integrated circuit (IC) chip stack employs a plurality of discrete chip carriers that are formed from dielectric tape layers such as fused low temperature cofired ceramic (LTCC) tape. The chips are lodged in cavities within the tape layers, and are either flip-chip or wire bond connected to electrical routings that extend along one or more tape layers toward the periphery of the carrier. Intercarrier interconnects are provided between the routings for adjacent carriers, either through the carrier side walls or externally. The carriers are mechanically secured to each other within the stack either by connectors that also provide an I/O signal capability, or by an adhesive if external electrical connectors are used. The structure is strong, compact, inexpensive, compatible with conventional IC chips and capable of disassembly and reassembly to replace a bad chip.

33 Claims, 2 Drawing Sheets

VERTICAL IC CHIP STACK WITH DISCRETE CHIP CARRIERS FORMED FROM DIELECTRIC TAPE

This is a continuation application Ser. No. 08/163,463, filed Dec. 8, 1993 now abandoned.

BACKGROUND OF THE INVENTION

1. Field of the Invention

The present invention relates to multi-chip module (MCM) circuit packages fabricated with dielectric tapes such as low temperature cofired ceramic (LTCC) tape, and more specifically to such circuit structures that are assembled in a three-dimensional stack.

2. Description of the Related Art

MCM packages generally include a dielectric structure consisting of a number of layers of insulating material with electrical circuit elements such as resistors, inductors and capacitor plates formed on their surfaces, and conductive routing patterns interconnecting the various elements. The insulating layers are thermally fused together so that the circuit elements are buried, with vertical interconnects (vias) extending through the insulating layers to interconnect circuit elements on adjacent layers.

One or more IC chips and/or discrete components are mounted to the surface of the dielectric structure and connected to its routing by wire bond, flip-chip or other connection techniques. In a flip-chip configuration, a surface of an IC chip upon which bonding pads are formed faces the dielectric structure, and the bonding pads are connected to mating bonding pads on the structure by electrically conductive "bumps" formed from solder, conductive epoxy or other suitable material.

LTCC tape is a desirable material for fabricating MCM structures. This tape includes a mixture of glass and ceramic fillers or recrystallizable glass which sinters at about 850° C., and exhibits a thermal expansion similar to alumina. The low-temperature processing is compatible with air fired resistors and precious metal thick film conductors such as gold, silver or their alloys. It also allows for the processing of base metals such as copper in a nitrogen or reducing atmosphere. A general treatise on LTCC technology is provided in Vitriol et al., "Development of a Low Temperature Cofired Multi-layer Ceramic Technology", *ISHM Proceedings*, 1983, pages 593–598. An example of an LTCC circuit package is described in U.S. Pat. No. 4,899,118 to Polinski, Sr., assigned to Hughes Aircraft Company, the assignee of the present invention.

A limitation of the present LTCC MCM technology is in the area occupied by the plural IC chips. It would be highly desirable to be able to reduce the area requirements for individual chips, and thus free up real estate for additional circuitry.

One approach to reducing the area required per chip has been to stack multiple chips vertically in a 3-D arrangement. An example of this approach is the DPS1MS8A3 CMOS SRAM Module by Dense-Pack Microsystems, Inc. In this product, sealed circuit modules are stacked and mounted on PC (printed circuit) boards. A custom fabricated die is required, with input/output (I/O) contacts located across the center of the chip, rather than around its periphery as in the great majority of chip configurations. All of the interconnects between adjacent modules are made by solder along the outer surfaces of the modules, where they can easily be damaged. The modules are formed from high temperature cofired ceramic (HTCC) material, and thus are not compatible with other processes that cannot withstand high temperatures. Also, they are designed for printed circuit board applications only.

Another 3-D circuit package is the SRAM Short Stack™ by Irvine Sensors Corporation of Costa Mesa, Calif. In fabricating this package, an expensive lapping process is used to smooth the sides of the individual chips to be stacked, and a metallization is added to each die to extend its contact pads out to the sides of the chip. The chips are then glued together vertically, with exposed and vulnerable interconnects extending along the outside of the stack. A particular disadvantage of this product is that the entire stack fails in the event a single chip within the stack is bad. Once the stack has been assembled, it cannot later be taken apart to replace a bad chip and then reassembled. A single bad chip thus results in the loss of the entire stack.

SUMMARY OF THE INVENTION

The present invention seeks to provide a 3-D IC chip stack that provides a significant area savings compared to 2-D arrays, is compatible with the benefits of LTCC construction, is compatible with standard IC chips that do not require any special fabrication, can employ internal interconnects that are protected from outside damage, and allows an individual bad chip to be replaced without losing the remainder of the chips.

These goals are achieved by vertically stacking a plurality of discrete dielectric tape chip carriers. Each carrier includes a floor formed from a plurality of dielectric tape layers, a cavity bounded by at least one additional tape layer above the floor, an IC chip lodged in the cavity, electrical routing that extends through the carrier body, and electrical connectors that connect the chip circuitry to its carrier's routing. Electrical interconnects are provided between the routings for adjacent carriers, and contacts are provided on the stack for external connections.

In particular embodiments the intercarrier interconnects extend through the side walls that surround the chip cavity of their respective carriers, and include conductive contacts that mechanically secure the carriers to each other. Multiple chip carriers can also be provided in a horizontal array at one or more of the carrier levels, with the routings for chips on the same level interconnected with each other. The stacks can be used inside MCM/hybrid circuits, or mounted directly on PC boards in either flip-chip, wire bond or leaded configurations. Within each carrier the chips can also be mounted by various methods, including flip-chip and wire bond. For wire bonded chips, thermally conductive dielectric spacers that leave enough peripheral area for the wire bonds can be provided between the exposed chip surfaces and the undersides of the next upper carriers to assist in heat dissipation. Other heat dissipation techniques include thermally conductive vias that extend through the floor of each carrier in the stack, and the use of a metal heat sink for the floor of the lowermost carrier. Hermetic sealing can be provided by extending the side walls of the top carrier up above the chip level, and providing a hermetically sealed lid.

These and other features and advantages of the invention will be apparent to those skilled in the art from the following detailed description, taken together with the accompanying drawings.

DETAILED DESCRIPTION OF THE INVENTION

Memory circuits currently account for approximately 60% of a typical MCM's surface area. The present invention provides a 3-D stacking configuration that allows circuits such as memories to be packaged in considerably less surface area; an area reduction of approximately two-thirds can be achieved with a three-high stack. The new technique is compatible with both standard and custom dies with peripheral I/Os, and can be used without special post processing. It allows currently available IC chips to be handled, tested, pre-burned-in and stacked to obtain both higher density and higher yields. Since most current MCMs have twenty memory chips and approximately three to six high I/O count gate arrays, there is a considerable potential for savings in surface area occupied by the chips. (The term "chip" as used herein includes both raw dies and packaged IC chips.)

Figure 1:
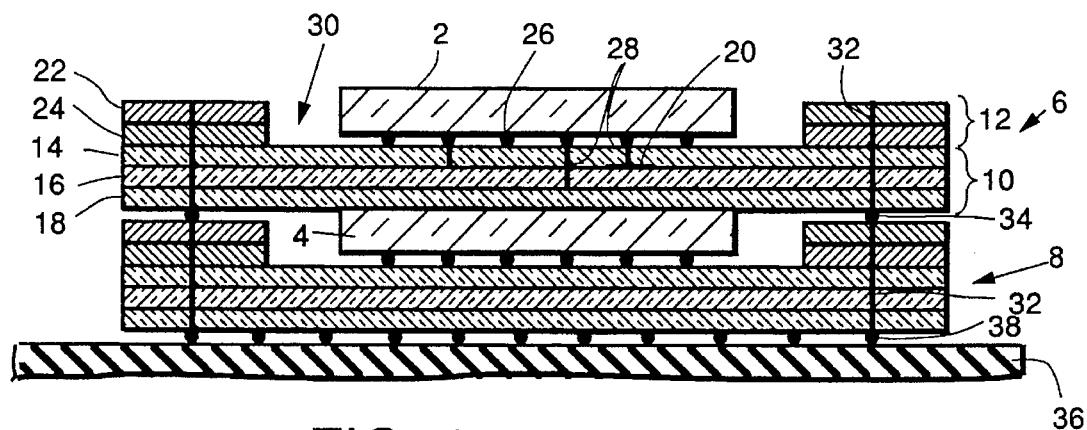
FIG. 1 is a sectional view of a flip-chip embodiment of the invention.

An application of the invention to a flip-chip configuration is illustrated in FIG. 1. Only two vertically stacked chips 2 and 4 are illustrated, although in practice considerably more chips could be stacked. The chips are typically formed from silicon, although other semiconductor materials could also be used.

A separate carrier is provided for each chip to facilitate the stacking, and to provide I/O connections for the chips. In the illustration of FIG. 1, the upper chip 2 is lodged in carrier 6, while the lower chip 4 is lodged in a separate carrier 8.

Each carrier is formed from a plurality of stacked layers of dielectric tape, preferably an LTCC tape such as DuPont Screen Tape® No. 951AT. Other types of dielectric tape could also be used. For example, high temperature cofired ceramic (HTCC) tape can also support electrical routing, but refractory metals with a higher resistivity are required because of the higher sintering temperatures that must be withstood. Laminates such as polyimide, fiberglass or plastic are also candidates, although they exhibit poor thermal conductivity and are not hermetic. Aluminum nitride (AlN) has a high thermal conductivity, and may be a desirable material for practicing the invention. While the remainder of this specification describes the invention in terms of LTCC, it should be understood that other types of dielectric tape might be used instead, depending upon the particular application.

Since the two carriers 6 and 8 are similar in construction, only the upper one 6 will be described in detail. It consists of a floor 10 formed from a plural number of stacked LTCC layers, and a side wall 12 that is formed from at least one LTCC layer and surrounds the chip 2. Three LTCC layers 14, 16 and 18 are illustrated for the floor. The surface of each tape layer would normally include a metallized routing pattern (illustrated in FIG. 2), and can also have passive electrical components 20 such as resistors, inductors and/or capacitor plates. The side wall 12 is illustrated as including two LTCC layers 22, 24; the number of layers used in any given application will normally depend upon the thickness of the IC chip 2.

The electrical circuitry is formed on the underside of the chip 2, which is flip-chip mounted to the upper surface of the upper floor LTCC layer 14. The chip is both electrically connected and mechanically secured to the carrier by means of conductive epoxy or solder "bumps" 26 between conductive pads on the underside of the chip and corresponding pads on the upper surface of the cavity floor. Other epoxies can be applied to the nonelectrical contact areas to aid in thermal and mechanical attachment if required. Individual floor pads can provide a connection either to the routing on the surface of the upper floor layer 14, or to routings and/or electrical components on the lower floor layers 16, 18 by means of vias 28. This type of chip mounting to a layered LTCC substrate is disclosed for a two-dimensional package in U.S. Pat. No. 4,899,118.

The LTCC layers are each about 90 micrometers (microns) thick after firing. An IC chip is typically manufactured about 500–600 microns thick, which allows it to withstand the manufacturing process. However, the chip can be lapped from its rear surface, using standard lapping techniques, in either the wafer or the die state, to a thickness on the order of one LTCC layer. Such lapping allows the height of the carrier, and thus of the overall stack, to be reduced, and thereby accommodate a greater number of chips and carriers.

The flip-chip mounted IC chip 2 is lodged within a cavity 30 that is formed by the floor 10 and the surrounding side walls 12. Multiple carriers with similarly mounted chips are vertically stacked as illustrated in FIG. 1. The electrical routing for each carrier is brought out along the surfaces of the floor layers to the side wall region, where connections between adjacent carriers are made. In the embodiment of FIG. 1, vertically aligned vias 32 extend through the side walls and floors of each carrier, with the vias for adjacent carriers mechanically and electrically connected by flip-chip connector bumps 34 in a manner similar to the connection of the IC chips to the floors of their respective carriers. The connector bumps 34 provide a mechanical integrity that holds the stack together. The exposed ends of the vias 32 serve as contact pads for the bumps.

The IC chips are preferably lapped so that they extend upward to contact the underside of the floor for the next higher carrier. This assists in heat dissipation through the stack. Memory architectures typically call for only one memory chip being activated at a time; the heat generated by whichever chip is activated at a particular time can thus transfer heat through the stack. Since memory chips commonly share data and address lines, all but one or two of the intercarrier interconnects 32 would typically extend through the entire stack and be connected to each chip within the stack.

Once it has been fabricated, the stack can be connected to a substrate, such as a common carrier with a matching temperature coefficient of expansion. The mechanical connections are preferably made by means of solder bumps or conductive epoxy 38 between contacts for the vias 32 on the stack, and corresponding contact pads on the common carrier 36.

Figure 2:
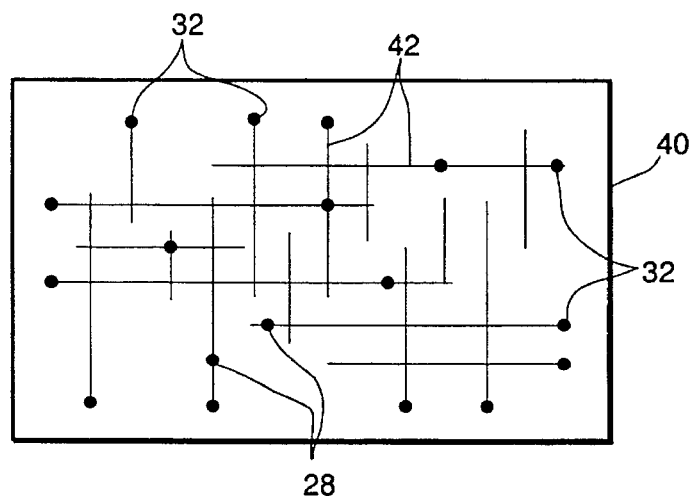
FIG. 2 is a plan view illustrating metallized routing on an LTCC layer in the floor of a chip carrier.

An illustrative electrical routing scheme formed in the floor 40 of one of the carriers is illustrated in FIG. 2. The routing consists of metallized traces 42 that extend between both the peripheral intercarrier interconnect vias 32 and the vias 28 that connect to the chips. The routing for a number of floor layers is superimposed in the illustration of FIG. 2; crossovers within any single floor layer would normally be avoided. The routing can be used to provide both I/O connections for the various chips, and internal connections for a given chip.

To fabricate a carrier, holes, cavities and/or slots are punched into individual tape layers to accommodate the IC chip and any other desired component such as capacitors. Routings and vias are screened onto the various layers as necessary. Silver is preferably used for the metallization, in contrast to the high resistivity refractory metals that must be used with the Dense-Pack Microsystems, Inc. chip stack mentioned above. The tape layers are then stacked in a frame that holds the vias in alignment, pressed together, and then fired in a conventional manner so that they shrink and adhere to each other, forming an integral atomic structure. Several carriers can be formed simultaneously at different locations on the same tape layers in this manner. After firing the unit is either scribed and broken apart into individual carriers, or left whole as a multi-chip carrier.

IC dies are then mounted in the carrier cavities. If the die is to be thinned, it is either thinned before being mounted or, in the case of flip-chip configurations, the chip and carrier can be thinned together after the chip has been mounted. A conventional lapping process is used that both thins the chip and provides a smooth surface for good thermal contact with an overlying carrier. After mounting the chip is subjected to the normal test, burn-in and other completion procedures. Multiple carriers are then stacked vertically and connected to each other by the epoxy or solder bumps 34. In mounting the chips to their respective carriers, and also in stacking the carriers together, the application of the conductive epoxy or solder should be controlled to avoid inadvertent short circuits between adjacent contacts.

If a bad chip is identified after the stack has been assembled, it can be removed simply by heating the stack to the epoxy curing temperature, separating the carriers, removing the bad chip from its carrier and replacing it with a new chip, and then reassembling the stack. This avoids a loss of the entire stack.

Figure 3:
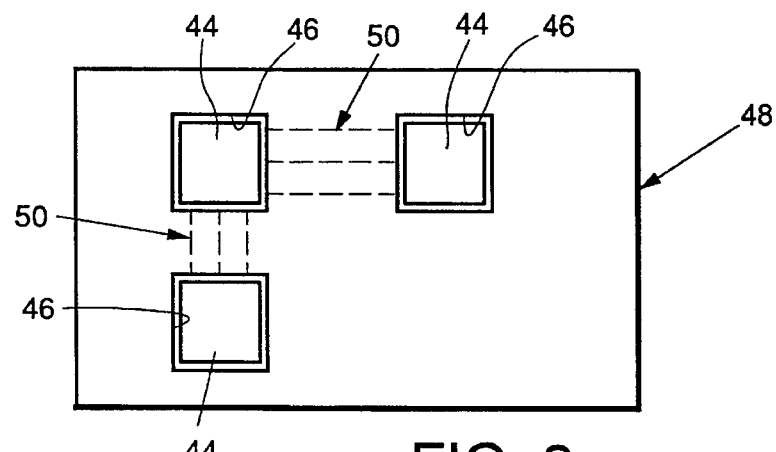
FIG. 3 is a plan view illustrating interconnected chips on a common carrier level.

FIG. 3 illustrates a multi-chip carrier in which individual chips 44 are lodged within respective cavities 46 in an assembly of LTCC layers 48. The LTCC layers provide a floor and sidewall for each of the chip cavities, as described above. Interconnections between chips can be made by metallized routings 50 that extend on one or more LTCC layers between the routings under the chips.

Figure 4:
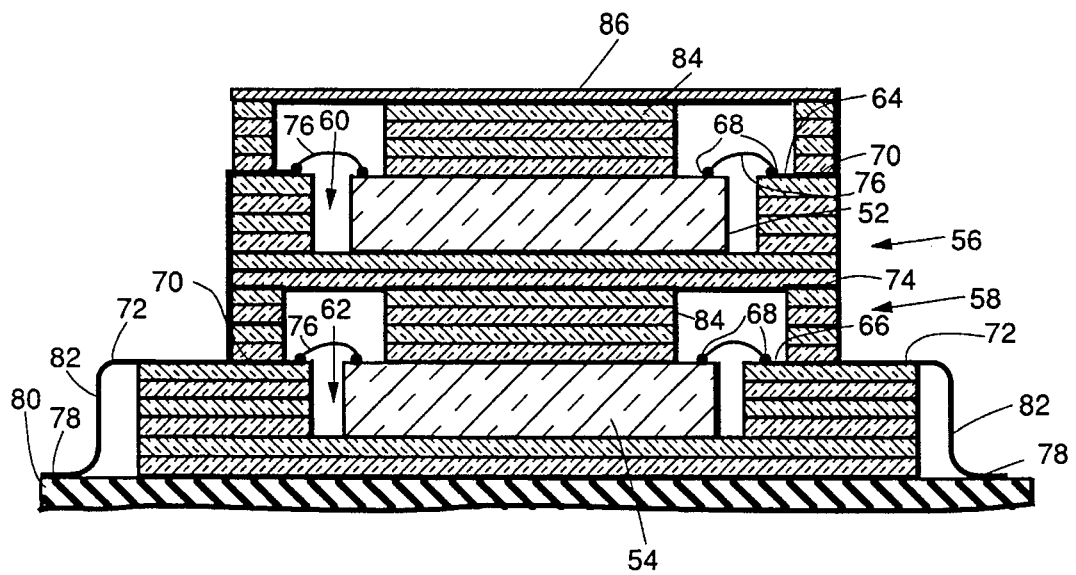
FIG. 4 is a sectional view of a wire bond embodiment of the invention.

An application of the invention to wire bonded chips is illustrated in FIG. 4. Again, only two chips 52, 54 and their respective carriers 56, 58 are illustrated, although additional chips and carriers could be provided in the stack. The carriers are formed from LTCC tape in a manner similar to the carriers of FIG. 1, with the chips 52, 54 lodged in respective carrier cavities 60, 62 above floors formed by underlying LTCC layers.

In this application, the carrier side walls are preferably formed with inward directed shelves 64, 66 at the level of the upper chip surface. Corresponding wire bond pads 68 are provided in the peripheral chip areas, and on the side wall shelves. The chip wire bond pads connect to the chip circuitry, while the side wall pads are brought out to the exterior of the carrier by electrical routing 70 that extends along the upper surface of the LTCC layer forming the shelf. While this embodiment could be implemented with vertically aligned vias 32 within the carrier side walls as in FIG. 1, the routing 70 is illustrated as being electrically connected to corresponding wire bond pads 72 on an outer peripheral shelf of the lowermost carrier by respective metallization traces 74 that extend down the exteriors of the carriers. Corresponding wire bond pads 68 inside the carriers are connected by respective wires 76, while the wire bond pads 72 outside the lowermost carrier are connected to corresponding pads 78 on a common carrier or PC board 80 or other mounting surface by respective wire bonds or brazed leads 82. Just as internal vias 32 could be substituted for the external connector traces 74 in FIG. 4, external connector traces could be used instead of internal vias in the embodiment of FIG. 1. Alternates to wirebonds or leads for connecting the bottom carrier to the substrate include ball grid arrays and peripheral arrays.

If desired, electrical routing can also be provided in the floor of each carrier and electrically connected to the chip circuits through vias (not shown) that extend up through the side walls of the cavity, and then through associated wire bond connections. The carriers are held together by a suitable adhesive or solder that can preferably be released at a temperature low enough to avoid damage to the chips, should access to a chip be desired after the stack has been assembled.

To assist in extracting heat from the assembly, dielectric spacers formed from a thermally conductive material such as beryllium oxide or aluminum nitride can extend up from each chip to the underside of the carrier for the next upper chip. The spacers 84 should be small enough to leave room for the wire bond contacts 68 around the peripheries of the chips, but large enough in area to provide for effective thermal transfer. Their upper surfaces are preferably lapped to provide a good contact with the next higher carrier. If hermetic sealing of the chips is desired, the side walls of the uppermost carrier 56 can be extended upward, and an air-tight lid 86 hermetically attached over the carrier.

Figure 5:
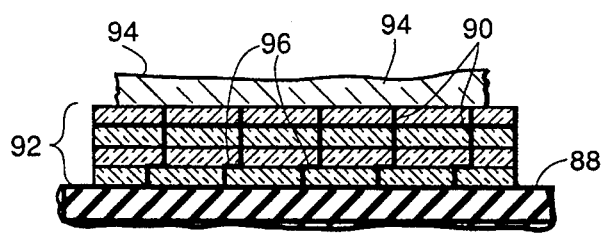
FIG. 5 is a fragmentary sectional view showing a thermal via heat dissipation technique that can be used with the invention.
Figure 6:
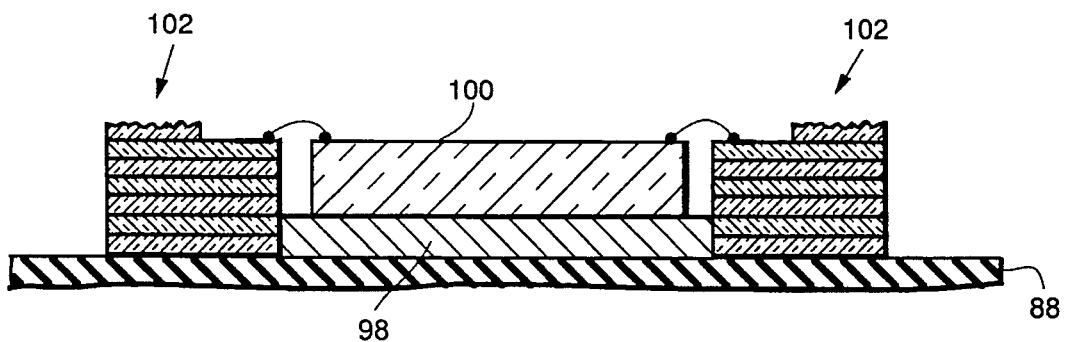
FIG. 6 is a fragmentary sectional view showing another heat dissipation technique.

FIGS. 5 and 6 illustrated additional heat dissipation techniques that can be used to extract heat from the stack, the lowermost carrier of which is shown mounted on a substrate 88 such as a PC board. In FIG. 5, metallic vias 90 are provided through the LTCC layers which form the floor 92 under an IC chip 94. The via in at least one LTCC layer is staggered with respect to the vias in adjacent layers, and connected to the vias in the adjacent LTCC layers by metallization 96 on the LTCC layer surfaces. This allows for hermetically sealed thermal connections between the chip and the substrate 88, and also provides electrical connections to routings in the floor layers. The technique is similar to that disclosed in U.S. Pat. No. 4,899,118.

In FIG. 6 a metallic heat sink 98 is used as the floor of the carrier for a wire bond chip 100. Wire bond connections to the chip are made through the carrier's LTCC side walls 102, as in FIG. 4. The chip 100 sits directly upon the heat sink floor 98 to dissipate heat.

While several embodiments of the invention have been shown and described, numerous variations and alternate embodiments will occur to those skilled in the art. For example, the chips can be connected to their respective carriers by means other than flip-chip or wire bond. Various lead configurations, tape automated bonding (TAB) and ribbon bonds could be used, depending upon the particular application. Accordingly, it is intended that the invention be limited only in terms of the appended claims.

We claim:

1. A vertical integrated circuit (IC) chip stack, comprising:
   a plurality of vertically stacked chip carriers, each carrier comprising:
   a dielectric body having a floor and side walls bounding a cavity,
   an IC chip lodged in said cavity wherein the upper surface of said chip, except for the uppermost chip in the stack, is in direct and thermal contact with the floor of the carrier immediately above it in the stack,
   electrical routing extending through the carrier body, and
   electrical connectors connecting said IC chip to its carrier's routing,
   electrical intercarrier interconnects between the routings for adjacent carriers, and
   stack contacts connected to respective intercarrier interconnects for making external connections to the stack.

2. The IC chip stack of claim 1, the electrical routing for at least some of said carriers comprising electrical intracarrier interconnects carried by the floors of said carriers and interconnecting different circuit portions of their respective chips.

3. The IC chip stack of claim 2, wherein the intracarrier interconnects for at least some of said carriers are arranged in multiple layers within their carrier floors.

4. The IC chip stack of claim 1, wherein said intercarrier interconnects extend through the side walls of their respective carriers.

5. The IC chip stack of claim 4, wherein said intercarrier interconnects include electrically conductive contacts between adjacent carriers that mechanically secure the carriers to each other within said stack.

6. The IC chips stack of claim 1, wherein an array of chip carriers is provided on at least one carrier level of said stack, with the chip carriers in each such horizontal level electrically interconnected with at least one other chip carrier in the same level by interconnecting their respective electrical routings.

7. The IC chip stack of claim 1, further comprising a wiring board, with said chip stack mounted to said wiring board and said stack contacts electrically connected to corresponding contacts on said wiring board.

8. The IC chip stack of claim 7, wherein said stack contacts comprise electrically conductive contacts between respective intercarrier interconnects and wiring board contacts that mechanically secure the stack to the wiring board.

9. The IC chip stack of claim 7, said stack contacts comprising wire bond pads, wherein said wire bond pads are wire bonded to said wire board contacts.

10. The IC chip stack of claim 1, wherein said chips are flip-chip mounted to the routings of their respective cavities.

11. The IC chip stack of claim 1, wherein said chips are wire bonded to the routings of their respective carriers, further comprising dielectric spacers extending from the upper surface of each chip, except for the uppermost chip in the stack, to the floor of the carrier immediately above it in the stack, said spacers leaving peripheral clearances on the upper surfaces of their respective chips, and wire bond pads within said peripheral clearances.

12. The IC chip stack of claim 11, where said carriers include shelves adjacent the upper surfaces of their respective chips, with wire bond pads provided on said shelves and connected to the routings for their respective carriers, and wire bonds extending between corresponding wire bond pads on said chips and on their carrier shelves.

13. The IC chip stack of claim 1, further comprising at least one discrete circuit element disposed in the floor of at least one of said carriers and connected to the chip in said carrier by the carrier's routing.

14. The IC chip stack of claim 1, further comprising vias filled with a thermally conductive material extending through the floor of the lowermost carrier in said stack to transport heat away from the chip in said lowermost carrier.

15. The IC chip stack of claim 14, wherein said vias each comprise a plurality of staggered via segments to inhibit air flow through the floor of said lowermost carrier.

16. The IC chip stack of claim 1, wherein the upper surface but not the lower surface of the lowermost chip in the stack bears electrical circuitry, the floor of the lowermost carrier in the stack comprises a metal heat sink, and said lowermost chip is in thermal contact with said heat sink.

17. The IC chip stack of claim 1, wherein the side walls of the uppermost carrier in said stack extend at least to the level of the upper surface of the chip in said uppermost carrier, and further comprising a lid hermetically sealing said uppermost carrier.

18. A vertical integrated circuit (IC) chip stack, comprising:
   a plurality of vertically stacked chip carriers, each carrier comprising:
   a plurality of joined dielectric tape layers, of which a plurality of lower tape layers provide a floor for the carrier and at least one upper tape layer has an opening which is bounded on the bottom by said floor, said opening forming a cavity in the carrier,
   an IC chip lodged in said cavity wherein the upper surface of each chip, except for the uppermost chip in the stack, is in direct and thermal contact with the floor of the carrier immediately above it in the stack,
   horizontal electrical routing extending along at least one tape layer in said floor,
   vertical electrical routing extending through at least the uppermost tape layer in said floor to said horizontal electrical routing, and
   electrical connectors connecting said IC chip to said vertical electrical routing,
   electrical intercarrier interconnects between the vertical electrical routings for adjacent carriers, and
   stack contacts connected to respective intercarrier interconnects for making external connections to the stack.

19. The IC chip stack of claim 18, wherein said intercarrier interconnects extend through the walls of their respective carriers.

20. The IC chip stack of claim 19, wherein said intercarrier interconnects include electrically conductive contacts between adjacent carriers that mechanically secure the carriers to each other within said stack.

21. The IC chips stack of claim 18, wherein an array of chip carriers is provided on at least one carrier level of said stack, with the chip carriers in each such horizontal level electrically interconnected with at least one other chip carrier in the same level by interconnecting their respective electrical routings.

22. The IC chip stack of claim 18, further comprising a wiring board, with said chip stack mounted to said wiring board and said stack contacts electrically connected to corresponding contacts on said wiring board.

23. The IC chip stack of claim 22, wherein said stack contacts comprise electrically conductive contacts between respective intercarrier interconnects and wiring board contacts that mechanically secure the stack to the wiring board.

24. The IC chip stack of claim 22, said stack contacts comprising wire bond pads, wherein said wire bond pads are wire bonded to said wire board contacts.

25. The IC chip stack of claim 18, wherein said chips are flip-chip mounted to the routings of their respective cavities.

26. The IC chip stack of claim 18, wherein said chips are wire bonded to the routings of their respective carriers, further comprising dielectric spacers extending from the upper surface of each chip, except for the uppermost chip in the stack, to the floor of the carrier immediately above it in the stack, said spacers leaving peripheral clearances on the upper surfaces of their respective chips, and wire bond pads within said peripheral clearances.

27. The IC chip stack of claim 26, where said carriers include shelves adjacent the upper surfaces of their respective chips, with wire bond pads provided on said shelves and connected to the routings for their respective carriers, and wire bonds extending between corresponding wire bond pads on said chips and on their carrier shelves.

28. The IC chips stack of claim 18, further comprising at least one discrete circuit element disposed along the surface of at least one of the dielectric tape layers in the floor of at least one of said carriers and connected to the chip in said carrier by the carrier's routing.

29. The IC chip stack of claim 18, further comprising vias filled with a thermally conductive material extending through the floor of the lowermost carrier in said stack to transport heat away from the chip in said lowermost carrier.

30. The IC chip stack of claim 29, wherein said vias each comprise a plurality of via segments that are staggered between successive tape layers to inhibit air flow through the floor of said lowermost carrier.

31. The IC chip stack of claim 18, wherein the upper surface but not the lower surface of the lowermost chip in the stack bears electrical circuitry, the floor of the lowermost carrier in the stack comprises a metal heat sink, and said lowermost chip is in thermal contact with said heat sink.

32. The IC chip stack of claim 18, wherein said upper tape layers for the uppermost carrier in said stack extend at least to the level of the upper surface of its chip, and further comprising a lid for hermetically sealing said uppermost carrier.

33. The IC chip stack of claim 18, wherein said joined dielectric tape layers comprise fused low temperature cofired ceramic (LTCC) tape layers.

* * * * *